United States Patent
Katznelson et al.

[19]

[11] Patent Number: 6,121,847
[45] Date of Patent: Sep. 19, 2000

[54] INJECTION LOCKED OSCILLATOR AUTOMATIC FREQUENCY CENTERING METHOD AND APPARATUS

[75] Inventors: Ron D. Katznelson, San Diego; Branislav A. Petrovic, La Jolla, both of Calif.

[73] Assignee: Broadband Innovations, Inc., San Diego, Calif.

[21] Appl. No.: 09/042,899

[22] Filed: Mar. 16, 1998

[51] Int. Cl.⁷ ....................................................... H03L 7/24
[52] U.S. Cl. .................. 331/44; 331/177 R; 331/177 V; 455/316; 455/318
[58] Field of Search .................................. 331/44, 177 R, 331/177 V; 455/316, 318

[56] References Cited

U.S. PATENT DOCUMENTS

| | | | |
|---|---|---|---|
| 5,107,272 | 4/1992 | Joynson et al. | 342/199 |
| 5,650,749 | 7/1997 | Main | 331/23 |

*Primary Examiner*—Siegfried H. Grimm
*Attorney, Agent, or Firm*—Jenkens & Gilchrist; Robert C Strawbrich

[57] ABSTRACT

A method for centering the frequency of an injection locked oscillator or (ILO) includes producing measurements of the magnitude and sign of the phase difference between ILO output signals in response to alternate high level and low level RF drive signals, and tuning the center frequency of the ILO in accordance with the measurements to minimize the phase difference.

1 Claim, 4 Drawing Sheets

3.4b maintain_TILO( ): new function called: states 2, 3

Input globals:

cal_ilo_chan
phi1_index: from Rotate_LO( )
old_TILO_dac: from prepare_dac_tbl

Output globals:

Rotate_Lo_phase_TILO
TILO_dac_nominal
daco_lut[ ]
calib_direction

```
( maintain_TILO )
         ↓
Get measured Φ₁ at point #1 from
Phi1_index
(calculated by Rotate_Lo( ))
         ↓
Get measured Φ₂ at point #2
I₂ = ad_samples[2] and Q₂ = ad_samples[3]
Phi2_index = compute_theta (I₂, Q₂)
Protect if Phi2_index not in first quad
         ↓
Phi_diff = Phi2_index - Phi1_index
         ↓
Rotate_LO_Phase_TILO = 0
         ↓
calib_direction = 0
         ↓
    < Phi_diff >
     TILO_WINDOW? >  No →
         ↓ Yes
calib_direction = UP         UP = +1
         ↓
Rotate_LO_phase_TILO =
TILO_dac_to_phase (TILO_dac_nom, + 1)
         ↓
    < Phi_diff <
     TILO_WINDOW? >  No →
         ↓ Yes
calib_direction = DOWN       DOWN = -1
         ↓
Rotate_LO_phase_TILO = TILO_dac_to_phase(TILO_dac_nom, -1)
         ↓
TILO_dac_nominal = TILO_dac_nominal + calib_direction
         ↓
TILO_stitch_adjust (TILO_dac_nominal, old_TILO_dac)
         ↓
Deposit: daco_lut[cal_ilo_chan] = TILO_dac_nominal
         ↓
     ( Return )
```

TILO_dac_to_phase( ) = +13
for 9° average phase shift,
for all chan the value is -13 for average phase shift

Fig. 4

INJECTION LOCKED OSCILLATOR AUTOMATIC FREQUENCY CENTERING METHOD AND APPARATUS

FIELD OF THE INVENTION

The invention relates to automatic frequency control of oscillators and in particular, to centering the free running frequency of Injection Locked Oscillators ("ILO") during normal operation.

BACKGROUND OF THE INVENTION

The use of Injection Locked Oscillators had received widespread attention in communication circuits and in frequency synthesis applications. For example, its advantages with respect to locking speed and selectivity is covered in articles by Adler, R. entitled 'A Study of Locking Phenomena in Oscillators.', *Proceedings of the I.R.E*, vol. 34; pp. 351–357, (1946)—hereinafter refered to as the Adler paper; by Uzunoglu,V and White, M. H. entitled 'The Synchronous Oscillator: A Synchronization and Tracking Network.', *IEEE Journal of Solid-State Circuits*, vol. SC-20; (6), pp. 1214–1225, (1985); by Armand, M. entitled 'On the Output Spectrum of Unlocked Driven Oscillators.', *Proceedings of the IEEE* (Letters), vol. 57; pp. 798–799,(1969)— hereinafter refered to as the Armand paper The ILO locks on a signal source if the source is within the frequency lock range of the ILO. Under this lock condition, the ILO generates a signal with a frequency that is identical to that of the driving signal with a transfer phase shift and it provides effective filtering of lower level spurious frequency components that might be present at the driving input to the ILO. The early work in Adler's ILO paper provides the transfer phase relationship and the lock range as a function of the ILO resonant circuit Q and the input drive level. In the lock range the output amplitude is fixed and equal to oscillator level wherein the output phase with respect to the nominal phase at the center of the lock range is given by an arcsine function: $\theta = \arcsin(f/a)$, wherein $f$ is the frequency offset from the center free running frequency of the ILO and a is the frequency lock range which is proportional to the drive level amplitude.

The transfer characteristics outside the lock range can be obtained from the first term of the Fourier analysis given in Armand's paper for the spectrum of an unlocked driven oscillator.

Following the Armand paper we have for $|f|>a$ the out-of-lock response as a function of the frequency offset with respect to the free running ILO frequency is proportional to $$i\left(\frac{f}{a}\right)\left(1 - \sqrt{1-\left(\frac{a}{f}\right)^2}\right) \qquad (1)$$

Therefore, in our model, the composite ILO response is given by Equation (2).

$$S(f,a) = \begin{cases} e^{i\arcsin(f/a)} & \text{for } |f| \le a \\ a \cdot V_a + i\left(\frac{f}{a}\right)\left(1 - \sqrt{1-\left(\frac{a}{f}\right)^2}\right) & \text{for } |f| > a \end{cases} \qquad (2)$$

The term $a \cdot V_a$ is due to drive level leakage into the ILO output structure and is proportional to input level through a and the complex coupling coefficient $V_a$, which typically is in the order of −0.1 (−20 dB and out-of phase). This composite response is shown in FIG. 1 for such typical $V_a$ value and in FIG. 2 for $V_a$ of the same magnitude but with a phase of −45°. As noted above FIG. 1 shows the Injection locked oscillator (ILO) selectivity characteristics. This phase-magnitude transfer function represent the response of the ILO to a constant level drive signal and is a finction of the normalized frequency centered about the free running frequency of the ILO. FIG. 2 shows that ILO response can often be skewed by phase offset of the driver leakage term. Here, the phase coupling is at −45 degrees. Alternatively, phase coupling of −135 degrees will produce an opposite effect of excentuating lower frequencies at the expense of higher frequencies.

The value of the ILO in signal synthesis could be realized only if its center frequency can be maintained so that it is within the lock range from the frequency of a desired signal source that one wishes to reproduce with significant rejection of undesired spectral components. Prior art methods of achieving that goal have been described by Joynson et al. In U.S. Pat. No. 5,107,272 issued on Apr. 21, 1992. By utilized the special phase transfer relationship, Joynson et al vary the drive frequency to track the free running frequency of the ILO so as to maintain lock. However, it is often desired to use a synthesized drive signal of a predetermined and non-variable frequency and still be able to reliably maintain ILO lock without unduly broadening the lock range. This will permit the accommodation of thermal drifts while still maintaining a superior selectivity due to lower lock range.

BRIEF DESCRIPTION OF THE DRAWINGS

FIG. 4 shows the control flow of the DSP used in FIG. 3.

DETAILED DESCRIPTION OF THE INVENTION

Figure 1:
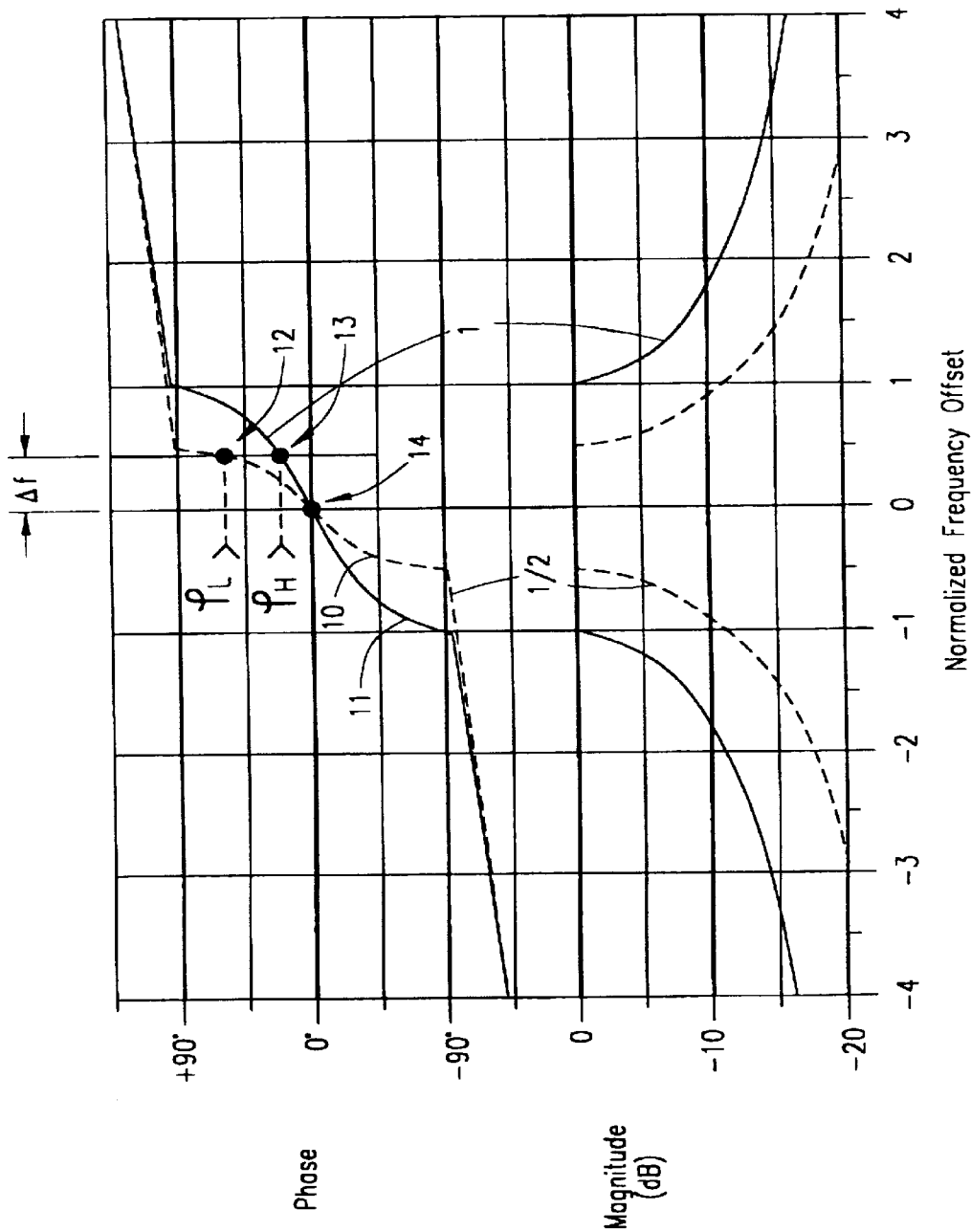
FIGS. 1 and 2 show selectivity characteristics of an injection locked oscillator.
Figure 2:
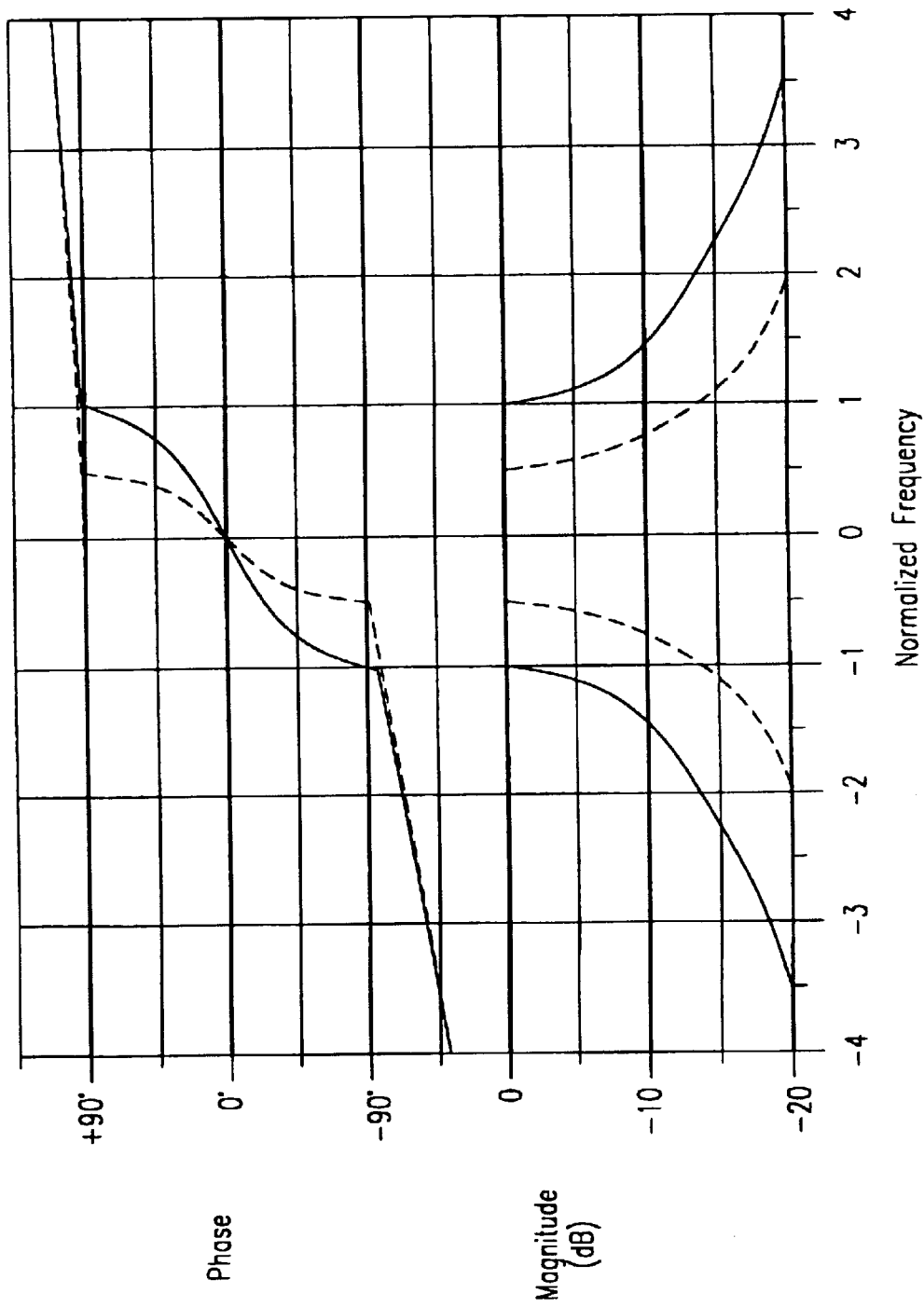

The above stated frequency centering goal can be accomplished if the input drive level to the ILO is permitted to undergo controlled (known) gated change during operation while the resulting output phase shift is measured and used for frequency centering control. This principle of the present invention can be observed by refering to the phase plot of FIG. 1. Phase plot 10 corresponds to a nominal (low) drive level to the ILO while phase plot 12 corresponds to a drive level that is 6 dB higher. It can be seen that if the driver frequency is equal to the center frequency of the ILO (desired condition designated by point 14), there will be no phase shift as a result of drive level change. If, however, there is an offset $f$ between the drive signal frequency and the ILO center frequency, output phase values $\phi_L$ and $\phi_H$ will result during Low level and High Level drive respectively, as show in points 12 and 13 respectively. Thus by measuring the phase difference (including the sign of that difference) between these two conditions that may be applied sequentially, one can determine not only the amount of frequency drift from the center, but more importantly, the direction. A tuning voltage that controls the center frequency of the ILO can thus be made to vary so as to minimize the measured phase shift between the two drive level modes described above.

Figure 3:
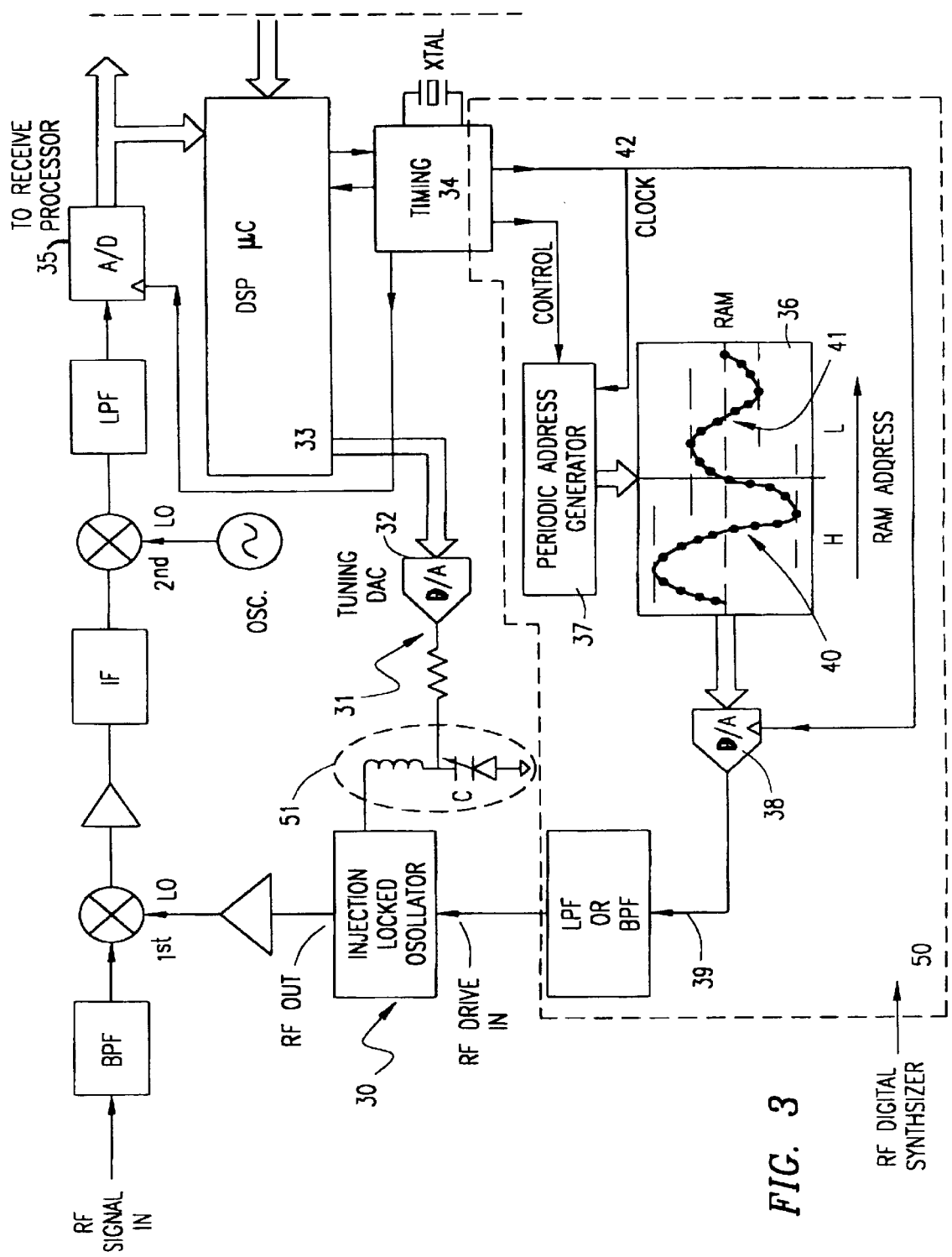
FIG. 3 shows an embodiment of the present invention for centering the frequency of an injection locked local oscillator in a synchronous receiver.

A preferred embodiment that utilizes the present invention is shown in FIG. 3. This is a synchronous receiver which utilizes the ILO 30 as a driven local oscillator, which locks on an RF digital synthesizer 50. The digital synthesizer is producing signals with two levels that are determined by the RAM record 40 and 41, which correspond to the HIGH and LOW drive levels respectively. The timing of such records is controlled by the periodic address generator 37 in accordance with predetermined receive signal levels that are known to be fixed during the two gated drive records. Thus, any phase shift recorded by the measuring system comprised of A/D 35 and the Digital Signal Processor 33 is assumed to be due to the offset of the ILO tuned circuit 51. The command to vary the center frequency is thus generated by the DSP through the tuning voltage supplied by the tuning DAC 32. UP or DOWN frequency tuning increments are supplied based on the phase shift difference observed between the two drive level modes. The DSP control flow is shown in FIG. 4.

We claim:

1. A method of centering the frequency of an injection locked oscillator (ILO) comprising the steps of varying the drive level of the ILO in a predetermined ratio during predetermined periods and varying a tuning parameter controlling the center frequency of the ILO in accordance with the phase shift between said predetermined periods.

* * * * *